(12) United States Patent
I et al.

(10) Patent No.: US 8,641,430 B2
(45) Date of Patent: Feb. 4, 2014

(54) BUS BAR EDGE STRUCTURE OF ELECTRIC JUNCTION BOX

(75) Inventors: Sunsoku I, Makinohara (JP); Takaaki Kakimi, Makinohara (JP)

(73) Assignee: Yazaki Corporation, Tokyo (JP)

( * ) Notice: Subject to any disclaimer, the term of this patent is extended or adjusted under 35 U.S.C. 154(b) by 3 days.

(21) Appl. No.: 13/559,652

(22) Filed: Jul. 27, 2012

(65) Prior Publication Data

US 2013/0029501 A1 Jan. 31, 2013

(30) Foreign Application Priority Data

Jul. 28, 2011 (JP) .................................. 2011-165207

(51) Int. Cl.
*H01R 12/00* (2006.01)

(52) U.S. Cl.
USPC ............................ 439/76.2; 439/110; 439/213

(58) Field of Classification Search
USPC .................................. 439/76.2, 212, 213, 110
See application file for complete search history.

(56) References Cited

U.S. PATENT DOCUMENTS

| | | | | |
|---|---|---|---|---|
| 6,220,875 B1 * | 4/2001 | Kawakita | | 439/76.2 |
| 6,875,923 B2 * | 4/2005 | Egawa et al. | | 174/68.2 |
| 7,172,436 B2 * | 2/2007 | Uezono | | 439/76.2 |
| 7,381,889 B2 * | 6/2008 | Hara | | 174/50 |
| 8,118,605 B2 * | 2/2012 | Yoshida | | 439/76.2 |
| 2002/0016093 A1 * | 2/2002 | Nakamura | | 439/76.2 |
| 2004/0029419 A1 * | 2/2004 | Uezono | | 439/76.2 |
| 2005/0153583 A1 * | 7/2005 | Kawamura et al. | | 439/76.2 |
| 2006/0040526 A1 * | 2/2006 | Shirota | | 439/76.2 |
| 2013/0029501 A1 * | 1/2013 | I et al. | | 439/76.2 |
| 2013/0034974 A1 * | 2/2013 | Akahori et al. | | 439/76.2 |

FOREIGN PATENT DOCUMENTS

JP 07-320627 A 12/1995

* cited by examiner

*Primary Examiner* — James Harvey

(74) *Attorney, Agent, or Firm* — Edwards Wildman Palmer LLP

(57) ABSTRACT

A bus bar edge structure of an electric junction box having a junction block main body, a bus bar-receiving gap arranged on the junction block main body, and a space communicating with the bus bar-receiving gap and arranged in a thickness direction of the bus bar includes a projection piece projecting from an edge of the bus bar at an opening side of the space in the thickness direction of the bus bar. An electric wire led from the junction block main body is guided to the projection piece so as to prevent interference with the edge of the bus bar. The projection piece functions as a press-operating portion configured to insert the bus bar into the bus bar-receiving gap. The projection piece is positioned in an opening of a longitudinal groove arranged in the space so as to prevent the electric wire from entering into the opening.

5 Claims, 4 Drawing Sheets

US 8,641,430 B2

BUS BAR EDGE STRUCTURE OF ELECTRIC JUNCTION BOX

The priority application Number Japan Patent Application No. 2011-165207 upon which this patent application is based is hereby incorporated by reference.

TECHNICAL FIELD

The present invention relates to a bus bar end structure of an electric junction box so as to prevent contact between an edge of a bus bar of an electric junction box and an electric wire.

BACKGROUND OF THE INVENTION

Conventionally, various bus bar attaching structures of an electric junction box are provided so as to attach a bus bar made of an electrical conduction metal plate in the electric junction box mounted on a vehicle and so on.

For example, in the Patent Document 1, as shown in FIG. 8, a box main boy (junction box main body) 62, which is made of insulating resin, of a fuse box (electric junction box) 61 includes a bus bar receiving portion 63 and a terminal receiving portion 64 arranged parallel to the bus bar receiving portion 63. The bus bar receiving portion 63 has an outer wall 63a, a inner wall 63b, and a backlash preventing portion 63c projecting toward an inner surface of the outer wall 63a and an inner surface of the inner wall 63b. A horizontally long bus bar 65 is inserted into the bus bar receiving portion 63 from top down, and a terminal with an electric wire not shown is inserted into the terminal receiving portion 64. As a result, each terminal of the fuse is connected to a terminal portion of the bus bar 65 and the terminal with the electric wire from bottom.

However, in the bus bar attaching structure of the electric junction box 61 disclosed in the Patent Document 1, an end portion 65a of the bus bar 65 in the width direction is positioned at the same level as an end portion of the box main body 62. For this reason, there is a possibility that the electric wires guided from the terminal receiving portion 64 and guided into the box main body 62 make contact with the end portion 65a, and thereby the electric wires are damaged.

The above problem tends to occur in a condition when a space between the outer wall 63a and the inner wall 63b is large before or after arranging the bus bar receiving portion 62. For example, when the terminal with the electric wire is fastened and connected to the bus bar 65 by a bolt or nut, the problem tend to take place because a space as a receiving space of the nut between the bus bar 65 and the walls 63a or 63b have to be provided.

Furthermore, in a case that the bus bar 65 is inserted into the bus bar receiving portion 63, when a worker presses the end portion 65a of the bus bar 65 by a hand thereof, the worker require a good push against sliding friction resistance between the bus bar 65 and an inner surface of the bus bar receiving portion 63 so as to fix the bus bar 65 in a locking arm of the bus bar receiving portion 63. As a result, workability for inserting the bus bar 65 is bad.

Accordingly, an object of the present invention is to provide a bus bar edge structure of an electric junction box enabling to prevent contact an edge of the bus bar with the electric wire in the electric junction box and thereby a damage of an electric wire. Specifically, the bus bar of the present invention which can solve the above problem when a space between the bus bar and a wall portion opposite to the bus bar is wide, and improve assembly work for attaching the bus bar in the electric junction box is provided.

[Patent Document 1] Japan Published Application No. H07-320627

SUMMARY OF THE INVENTION

In order to attain the above object, a bus bar edge structure of an electric junction box having a junction block main body, a bus bar-receiving gap arranged on the junction block main body, and a space communicating with the bus bar-receiving gap and arranged in a thickness direction of the bus bar according to a first aspect of the present invention, the bus bar edge structure comprising: a projection piece projecting from an edge of the bus bar at an opening side of the space in the thickness direction of the bus bar, wherein an electric wire led from the junction block main body is guided to the projection piece so as to prevent interference with the edge of the bus bar.

Preferably, according to a second aspect, in the bus bar edge structure of the electric junction box of the first aspect, the projection piece functions as a press-operating portion configured to insert the bus bar into the bus bar-receiving gap.

Preferably, according to a third aspect, in the bus bar edge structure of the electric junction box of the first or second aspect, the space includes a longitudinal groove in which a nut is attached and a working space in which a bolt is fastened, and the projection piece is positioned in an opening of the longitudinal groove so as to prevent the electric wire from entering into the opening.

Preferably, according to a fourth aspect, in the bus bar edge structure of the electric junction box of the third aspect, a pair of partition ribs is formed in the longitudinal groove and extends to the opening of the longitudinal groove, and the projection piece is closely arranged between the pair of the partition ribs.

Preferably, according to a fifth aspect, in the bus bar edge structure of the electric junction box of one of the first, second, third or fourth aspect, the projection piece is arranged in one side of the bus bar in the longitudinal direction, a U-shaped folded connection is arranged in the other side of the bus bar in the longitudinal direction, and the projection piece and the folded connection function as a press-operating portion configured to insert the bus bar into the bus bar-receiving gap.

EFFECT OF THE INVENTION

According to the present invention of the first aspect, even if the electric wire is entered into a space crossed to the bus bar-receiving gap of the junction block main body, the projection piece of the bus bar prevents the entry of the electric wire. As a result, contact between the edge of the bus bar and the electric wire and damage of the electric wire can be prevented. Thus, reliability of electrically connection of the electric junction box can be improved. Furthermore, when the bus bar is pushed and assembled in the bus bar-receiving gap of the junction block main body, assembly work of the bus bar can be increased by pushing the projection piece of the bus bar.

According to the present invention of the second aspect, since the bus bar can be pressed into the bus bar-receiving gap of the junction block main body by pushing the projection piece with a hand, assembly work for attaching the bus bar in the electric junction box can be improved.

According to the present invention of the third aspect, the projection piece can securely prevent the electric wire from entering into the space including the longitudinal groove and the working space and then interfering with the bus bar edge interfering with the edge of the bus bar.

According to the present invention of the fourth aspect, even if the electric wire is arranged outside of the projection piece, the electric wire abuts on the partition ribs arranged in both sides of the projection piece. Thereby, contact between the electric wire and the bus bar edge can be prevented.

According to the present invention of the fifth aspect, even if a long bus bar is provided, the bus bar can be smoothly and firmly inserted into the bus bar-receiving gap by pressing two points, that is the projection piece and the folded connection. Furthermore, assembly work for attaching the bus bar in the electric junction box can be improved.

The above and other objects and features of this invention will become more apparent from the following description taken in conjunction with the accompanying drawings.

DESCRIPTION OF THE PREFERRED EMBODIMENT

FIGS. 1 to 7 show a bus bar edge structure of an electric junction box according to an embodiment of the present invention. The bus bare edge structure may be referred to as a bus bar attaching structure.

Figure 1:
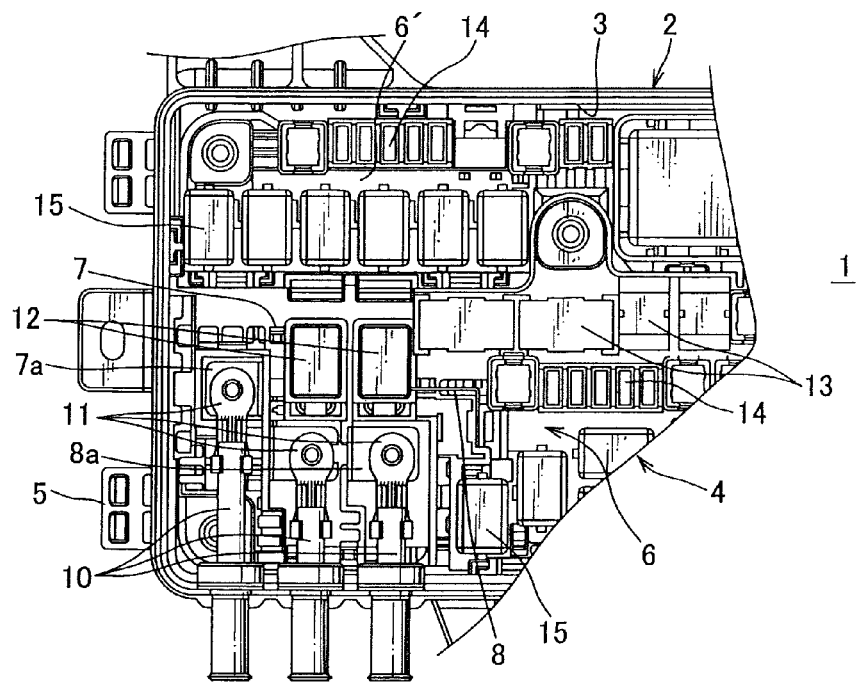
FIG. 1 is a plan view (a top view) showing an electric junction box according to an embodiment of the present invention.

As shown in FIG. 1, the electric junction box 1 includes a lower cover 2, a junction block 4, and an upper cover not shown. The lower cover 2 is an electric junction box main body, has a bottom portion, and is made of insulating resin. The junction block 4 is attached to the lower cover 2 from an upper opening 3 of the lower cover 2 with a state mounted on a tray not shown. The upper cover covers the upper opening 3 of the lower cover 2, and is fixed in a hinge 5 arranged on either side of the lower cover 2.

The junction block 4 includes a junction block main body 6 made of insulating resin, at least three bus bars 7, 8, 9 (see FIG. 2) received in the junction block main body 6, power-supply terminals 11 with an thick electric wire 10, and electric components mounted on the upper portion of the junction block main body 6. The power-supply terminals 11 are respectively connected to terminal plates 7a, 8a, 9a of the bus bars 7-9 with a bolt or nut, and fixed thereto. The electric components are like fusible links 12 and 13, a fuse 14, and a relay 15, and connected to bus bars 7-9 and a terminals with a thin electric wire not shown for distributing.

Figure 2:
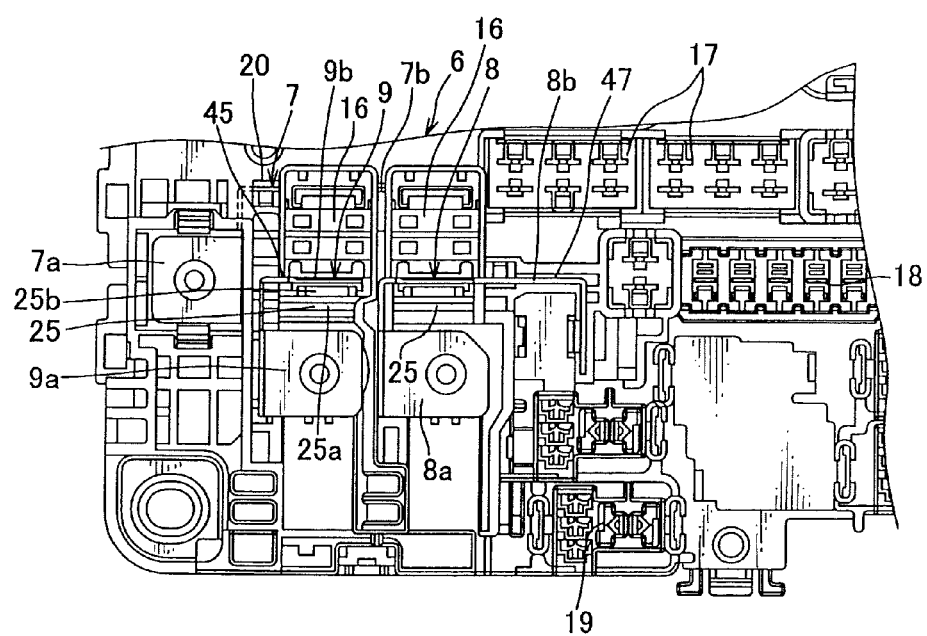
FIG. 2 is a plan view (a top view) showing an bus bar edge structure of the electric junction box according to the embodiment.

As shown in FIG. 2, first bus bar 7 is positioned in the center of the junction block main body 6 in a front-back direction. The terminal plate 7a is positioned at the left side of the junction block main body 6, and a horizontally long bus bar main body 7b is positioned on the bottom end of the junction block main body 6. Second bus bar 8 and third bus bar 9 are positioned in parallel. Each bus bar main body 8b, 9b is positioned parallel to the first bus bar main body 7b at the upper end of the junction block main body 6. The first bus bar main body 7b is extended to a right end side in FIG. 2. In FIG. 2, the reference signs 16 and 17 show a fusible link attaching portion, the reference sign 18 shows a fuse attaching portion, and the reference sing 19 shows a relay attaching portion.

Figure 3:
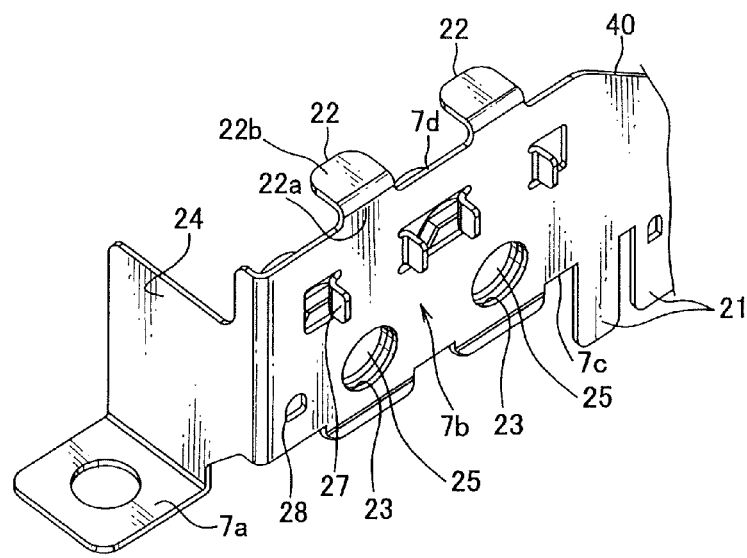
FIG. 3 is a bottom perspective view showing the bus bar according to the embodiment.

FIG. 3 is reversed from FIGS. 1 and 2, and shown. So, "up" in FIGS. 1 and 2 is "down" in FIG. 3.

As shown in FIG. 3, the first bus bar 7 has the flat terminal plate 7a including a hole, the bus bar main body 7b, a plurality of tab-shaped terminal portions 21, two projection pieces 22, and a hole 23 for inserting a bolt. The terminal plate 7a is exposed on the upper surface of the junction block main body (see FIG. 2), and connected to the power-supply terminal 11 (see FIG. 1) located on the left end side by thread fastening. The bus bar main body 7b is inserted into a bus bar-receiving gap 20 (see FIG. 4) arranged perpendicular to the bus bar main body 7b. The tab-shaped terminal portions 21 are located in parallel, and projects upward from an upper end 7c of the bus bar main body 7b. Each projection piece 22 is bent into L-shape from a lower end 7d of the bus bar main body 7b in a thickness direction of the bus bar main body 7b, and projected. Furthermore, the projection piece 22 is provided so as to prevent interference with electric wire and press the bus bar. The hole 23 is arranged in the bus bar main body 7b at the upper side of each the projection piece 22. In particular, the two projection pieces 22 of the first bus bar 7 are feature parts of the embodiment of the present invention.

The bus bar main body 7b is bent at a right angle on the left end side. Thereby, the terminal plate 7a is projected from an upper end of a bent plate 24 to the left side. Each the projection piece 22 is constructed of a supporting portion 22a vertically extended from the lower end 7d of the bus bar main body 7b and a base portion 22b horizontally projecting from the lower end of the supporting portion 22a in a direction in which the bent plate 24 is bent, that is in an anterior direction.

Figure 4:
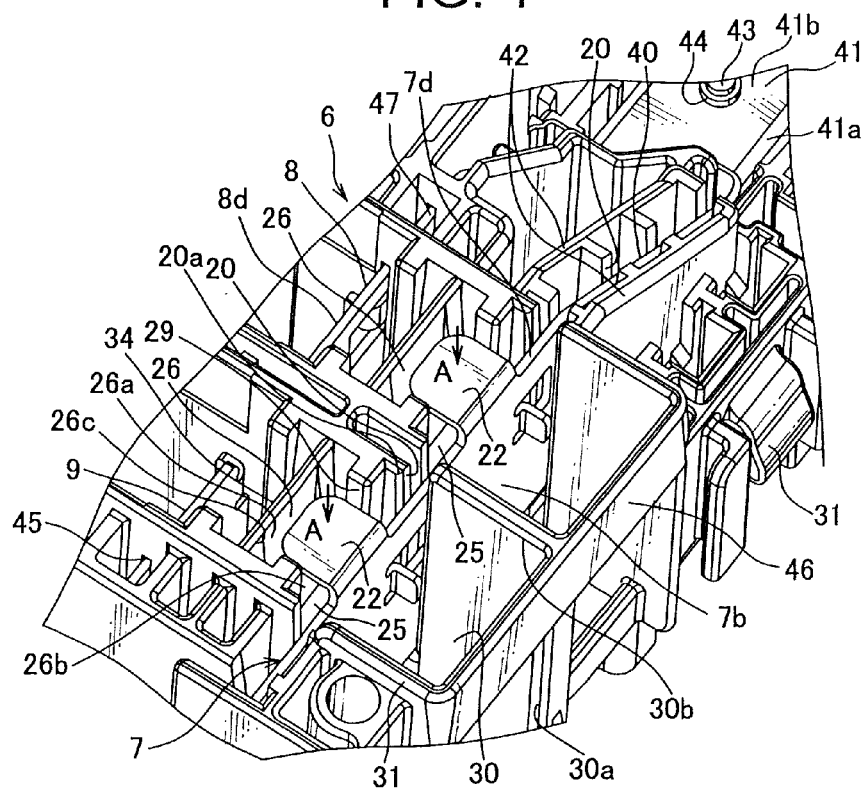
FIG. 4 is a bottom perspective view showing the bus bar edge structure of the electric junction box from below according to the embodiment.

A nut 25 is opposed to the hole 23 at the upper side of the projection piece 22 (a nut 25 gets in touch with the outer edge of the hole 23), and is pressed and fixed into a longitudinal groove (space) 26 of the junction block main body 6 in FIG. 4. Electric wire guide pieces 27 are arranged in the bus bar main body 7b between the hole 23 and the projection piece 22 in FIG. 3, and projected in a direction opposite to the projecting direction of the projection piece 22. A locking arm or locking projection (not shown) of the junction block main body 6 is engaged with a small hole 28 of the bus bar main body 7b, and thereby the bus bar 7 is locked.

The nut 25 includes a rectangular flange 25a (see FIG. 2) for anti-rotation, and a base portion 25b being main body (see FIG. 2). As shown in FIG. 4, a pair of partition ribs 29 is arranged in the center of the longitudinal groove 26. The flange 25a of the nut 25 is located on a front side of the longitudinal groove 26a in the partition rib 29. The base portion 25b of the nut 25 passes through the partition rib 29, and is located on a back side of the longitudinal groove 26b, and thereby contacts with the bus bar main body 7b. The back side of the longitudinal groove 26b is communicating with the bus bar-receiving gap 20 extending in a horizontal direction with a slit-shape, and a working space 30 which inserts thread fastening tool such as a driver from behind forward is communicated at the back of the bus bar-receiving gap 20. The working space 30 is surrounded with a wall portion 31, and has openings 30a and 30b. The opening 30a is positioned in the back portion of the working space 30, and the opening 30b is positioned in the bottom portion.

The thread fastening tool is horizontally inserted into the space 30 from the opening 30a toward the bus bar main body 7b. For this reason, a sub junction block main body 6' (see FIG. 1) is engaged with the back end of the junction block main body 6 by locking means such as a locking arm 31, and is included in the junction block 4 (see FIG. 1).

Figure 5:
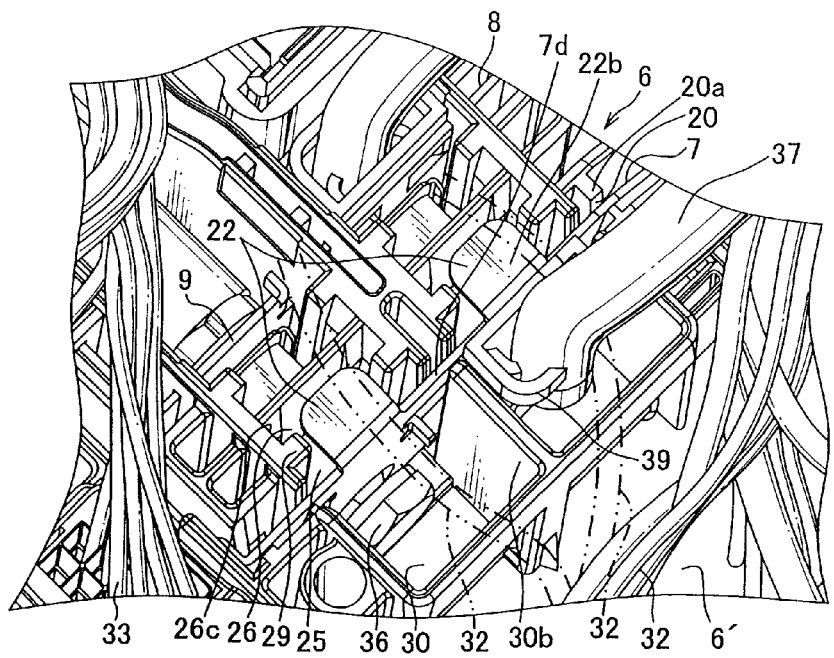
FIG. 5 is a bottom perspective view showing a state receiving en electric wire of the electric junction box with a projection piece of the bus bar.
Figure 6:
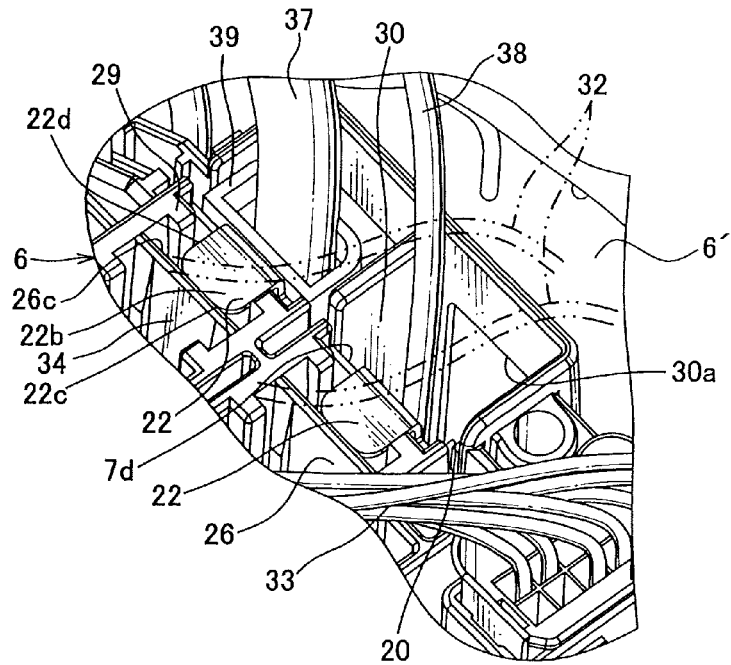
FIG. 6 is a bottom perspective view showing the state receiving the electric wire of the electric junction box with the projection piece of the bus bar at a different angle.

The lower opening 30b of the working space 30, the lower opening 20a of the bus bar-receiving gap 20, and the lower opening 26c of the longitudinal groove (space) 26 for pressing the nut are relatively-long communicated in the longitudinal direction. As a result, as shown in FIGS. 5 and 6, for example, a rear electric wire 32 and a right-and-left electric wire 33 are easily entered into the lower opening 26c of the space 26 and the lower opening 30b of the space 30, and tends to interfere with an edge of the lower end (end) 7d of the bus bar 7 in the lower openings 26c and 30b. When those electric wires 32 and 33 are pressed upward with a tray made of insulating resin, or the bottom wall of the lower cover 2 without using the tray, those electric wires 32 and 33 are easily pressed in the lower end 7d of the bus bar 7.

Figure 7:
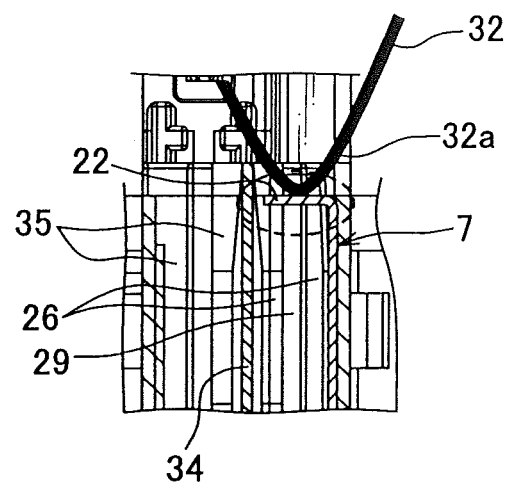
FIG. 7 is a longitudinal sectional-view showing a state receiving the electric wire with the projection piece of the bus bar.
Figure 8:
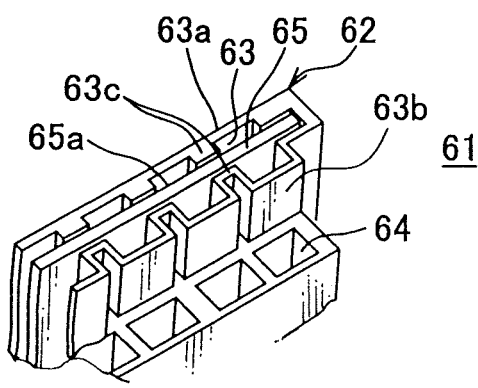
FIG. 8 is a perspective view showing a bus bar attaching structure of a conventional electric junction box.

However, as shown in FIGS. 5-7, the lower surface of the base portion 22b in the projection piece 22 which is arranged in the bus bar 7 touches or receives with the electric wire 32 in the lower opening 26c of the longitudinal groove 26 for attaching the nut, and thereby the interference between the lower end 7d which is arranged above the projection piece 22 of the bus bar 7 and the electric wire 32 can be prevented. The electric wires 32 and 33 in FIGS. 5 and 6 are electric wires with the terminal connected to the relay of the sub junction block 6', the fuse, or the fusible link, respectively. In FIGS. 5 and 6, a portion of the rear sub junction block 6' is omitted.

Furthermore, the projection piece 22 is positioned between the pair of partition ribs 29, that is, the partition ribs 29 are positioned on the both sides of the projection piece 22 in the width direction. For this reason, the electric wire 32 deviating from the projection piece 22 in the horizontal direction abuts on the lower surface of the partition rib 29, and thereby the interference between the lower end 7d of the bus bar main body 7b continuing to the projection piece 22 and the electric wire 32 is prevented. The lower surface of the partition rib 29 is projected below the lower surface of the projection piece 22.

FIG. 7 shows a case when an extension portion 32a of the electric wire is bent upward so that the shape thereof is formed in a U-shape, and abuts on the lower surface of the projection piece 22 of the bus bar 7. In FIG. 7, the reference sign 26 is a longitudinal groove 29 for attaching the nut, the reference sing 29 is the partition rib, the reference sign 34 is a vertical division wall, and the reference sign 35 is longitudinal grooves for attaching the nut against the first and second bus bars 8 and 9.

As shown in FIGS. 5 and 6, an electric wire with a terminal 37 and an electric wire with a terminal 38 are connected to the bus bar 7 fixed in the nut 25 with the bolt 36, and guided along the bus bar 7 downward. As a result, even if the thin electric wire 38 is bent, the contact between the lower end 7d of the bus bar 7 and the electric wire 38 is prevented by the projection piece 22. The reference sign 39 in FIGS. 5 and 6 shows an insulating coating crimp piece of a crimp terminal.

As shown in FIG. 6, the lower surface of the base portion 22b of the projection piece 22 is positioned above the lower end 26c of the longitudinal groove 26 for attaching the nut, that is, on the inside of the longitudinal groove 26. Preferably, at least the lower surface of the base portion 22b of the projection 22 is positioned in the same plate as the lower end 26c of the longitudinal groove 26 or above the lower end 26c.

As shown in FIGS. 5 and 6, the length of the projection piece 22 (namely, the length from the supporting portion 22a to the front end 22c) is extended so that the front end 22c of the projection piece 22 approaches the division wall 34 in the longitudinal groove 26, and a space which is equal to or lower than the outer diameter of the electric wire 32 is provided between the front end 22c and the division wall 34. Furthermore, the width of the projection piece 22 in the horizontal direction is widely formed so that an edge 22d approaches the partition rib 29 in the longitudinal groove 26, and a space which is equal to or lower than the outer diameter of the electric wire 32 is provided between the edge 22d and the partition rib 29.

The bus bar 7 is pressed in the vertical bus bar-receiving gap 20 of the block main body 6, and the lower end 7d of the bus bar 7 is positioned in the bus bar-receiving gap 20. More specifically, the lower end 7d of the bus bar 7 is positioned above the lower opening 20a of the bus bar-receiving gap 20. In this regard, it is required to deep press the bus bar 7 into the bus bar-receiving gap 20 because the interference between the lower end 7d of the bus bar and the electric wire 32 is prevented by the projection piece 22. For this reason, it is enough to shallowly press the bus bar 7 into the bus bar-receiving gap 20. Thus, assembly work for attaching the bus bar 7 to the block main body 6 can be easily performed.

Furthermore, as shown in the arrow A of FIG. 4, when the bus bar 7 is pressed into the bus bar-receiving gap 20, the assembly work of the bus bar 7 can be simple and easily performed by pressing the two projection pieces 22 with a finger of a worker in the arrow A direction. The large projection piece 22 functions as a press-operating portion configured to insert the bus bar into the electric junction box.

As shown in FIGS. 3 and 4, a left half portion including the projection pieces 22 of the bus bar 7 is integrally connected with a folded portion 41 (FIG. 4) folded in a U-shape via a middle portion having a inclined portion 40. The inclined portion 40 is positioned above the end of the bus bar-receiving gap 20 arranged between walls 42 close to the junction block main body 6. As a result, the contact between the inclined portion 40 and the electric wire 32 is prevented.

The U-shaped folded portion (folded connection) 41 has a vertical plate portion 41a, a tub-shaped terminal formed in the plate portion 41a, and a horizontal bottom plate portion 41b coupling the plate portion 41a. In the bottom plate portion 41b, an engaging hole 44 against a locating pin 43 of the junction block main body 6 is arranged. The bus bar 7 is smoothly and securely inserted in the bus bar-receiving gap 20 without being lifted and inclined by pressing together the bottom plate portion 41b and the projection piece 22 with a finger or hand.

The bottom plate portion 41b of the U-shaped folded portion 41 is exposed on the lower end of the junction block main body 6. However even if the bottom plate portion 41 comes into touch with the electric wire 32, there is no problems. The bottom plate portion 41b is provided so as to electrically connect the plate portion 41a with the tub-shaped terminal each other. On the other hand, the projection piece 22 is provided so as to prevent the interference between the lower end 7d of the bus bar 7 and the electric wire 32 in the longitudinal groove 26 (namely, space) for attaching the nut and the working space 30 for thread fastening. Thus, the bottom plate portion 41b differs from the projection piece 22. Also, the projection piece 22 projects in the same direction as the bottom plate portion 41b in a state in which the bus bar 7 is spread (that is, a punching state). For this reason, material yield is good.

Each the nut 25 shown in FIGS. 3 and 4 is arranged on the lower side of the fusible link attaching portion 16 adjacent to the junction block main body 6 shown in FIG. 2, and the terminal of the fusible link 12 is connected to the bus bar main body 7b of the bus bar 7 with the bolt 36 shown in FIG. 5 or nut 25 and screwed thereto. Each the tab-shaped terminal portion 21 of the bus bar main body 7b shown in FIG. 3 is arranged in the fusible link attaching portion 17 shown in FIG. 2, and connected to the terminal of the fusible link 13 shown in FIG. 1 through a junction terminal.

The second bus bar 8 in FIGS. 2 and 4 is inserted into a second bus bar-receiving gap 44 from the top of the junction block main body 6 without being inserted from the bottom thereof. The second bus bar-receiving gap 44 is formed in a notch shape at the top of the junction block main body 6.

Thus, since a bottom end 8d of the second bus bar 8 is arranged above the lower end of the junction block main body 6, it is not possible to get in touch with the electric wire 32. This is also applied to the third bus bar 9. A third bus bar-receiving gap is shown with the reference sign 45 in FIG. 4.

As shown in FIG. 5, one terminal of the fusible link 12 in FIG. 1 is connected to the first bus bar 7, and fixed with the nut or bolt. Furthermore, each the other terminal thereof is connected to the second bus bar 8 and the third bus bar 9, and fixed with the nut or bolt. When the second bus bar 8 and the third bus bar 9 are respectively inserted into the second bus bar-receiving gap 44 and third bus bar-receiving gap 45 in the same manner as the first bus bar 7, the projection piece 22 for preventing the interference of the electric wire and assembling is formed in the bus bars 8 and 9.

In the above embodiment, the junction block 4 having the bus bar 7 is arranged in the lower cover 2, however it is not limited thereto. For example, in an electric junction box (not shown) including an upper cover, a synthetic resin frame, and a lower cover, the junction block 4 having the bus bar 7 may be arranged in the frame.

In this case, the electric wire 32 positioned in the lower cover might have the potential to interfere with the lower end 7d of the bus bar 7. However, the interference between the bus bar and the electric wire can be prevented by applying the projection piece 22 described in the above.

Furthermore, in the above embodiment, the bus bar 7 is received and positioned between the longitudinal groove 26 in which the but is pressed and the working space 30, but it is not limited. For example, when the working space 30 is not provided, and a vertical rear wall 46 (see FIG. 4) of the working space 30 is arranged close to the bus bar main body 7b, the electric wire 32 might be entered in the longitudinal groove 26. However, the projection piece 22 receives the electric wire 32, and thereby the contact between the electric wire 32 and the lower end 7d of the bus bar main body 7b can be prevented.

While, in the embodiment, the present invention is described, it is not limited thereto. Various change and modifications can be made with the scope of the present invention.

INDUSTRIAL APPLICABILITY

The bus bar edge structure of the electric junction box according to the present invention can prevent contact between the edge of the bus bar and the electric wire in the electric junction box, and can be used for improving work inserting the bus bar into the electric junction box.

What is claimed is:

1. A bus bar edge structure of an electric junction box having a junction block main body, a bus bar-receiving gap arranged on the junction block main body, and a space communicating with the bus bar-receiving gap and arranged in a thickness direction of the bus bar, the bus bar edge structure comprising:
   a projection piece projecting from an edge of the bus bar at an opening side of the space in the thickness direction of the bus bar,
   wherein an electric wire led from the junction block main body is guided to the projection piece so as to prevent interference with the edge of the bus bar.

2. The bus bar edge structure of the electric junction box according to claim 1, wherein the projection piece functions as a press-operating portion configured to insert the bus bar into the bus bar-receiving gap.

3. The bus bar edge structure of the electric junction box according to claim 1, wherein the space includes a longitudinal groove in which a nut is attached and a working space in which a bolt is fastened, and the projection piece is positioned in an opening of the longitudinal groove so as to prevent the electric wire from entering into the opening.

4. The bus bar edge structure of the electric junction box according to claim 3, wherein a pair of partition ribs is formed in the longitudinal groove and extends to the opening of the longitudinal groove, and the projection piece is closely arranged between the pair of the partition ribs.

5. The bus bar edge structure of the electric junction box according to claim 1, wherein the projection piece is arranged in one side of the bus bar in the longitudinal direction, a U-shaped folded connection is arranged in the other side of the bus bar in the longitudinal direction, and the projection piece and the folded connection function as a press-operating portion configured to insert the bus bar into the bus bar-receiving gap.

* * * * *